(12) United States Patent
Lee et al.

(10) Patent No.: US 7,499,676 B2
(45) Date of Patent: Mar. 3, 2009

(54) LOW VOLTAGE DIFFERENTIAL SIGNALING TRANSCEIVER

(75) Inventors: Jac-Youl Lee, Suwon-si (KR); Jae-Suk Yu, Seoul (KR); Jong-Seon Kim, Sungman-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 489 days.

(21) Appl. No.: 11/244,831

(22) Filed: Oct. 6, 2005

(65) Prior Publication Data
US 2006/0234650 A1     Oct. 19, 2006

(30) Foreign Application Priority Data
Mar. 17, 2005    (KR) ............................. 2005-0022410

(51) Int. Cl.
*H04B 1/44*    (2006.01)
(52) U.S. Cl. ............................... 455/78; 455/73; 455/91; 455/127.1; 455/127.5; 330/9; 326/9; 326/14; 326/15; 326/16
(58) Field of Classification Search ............... 455/78, 455/73, 127.1, 127.5, 91; 326/9, 14–16, 326/63–65; 330/9
See application file for complete search history.

(56) References Cited

U.S. PATENT DOCUMENTS
6,639,434 B1    10/2003   Rahman
6,720,805 B1    4/2004    Haas 2002/0180410 A1 *  12/2002  Brooks ......................... 323/282
2003/0174539 A1 *  9/2003   Byeon et al. ............ 365/185.21
2003/0201799 A1 *  10/2003  Takauchi et al. ............. 326/127
2004/0192408 A1 *  9/2004   Sharp et al. .................. 455/572

FOREIGN PATENT DOCUMENTS
JP          62-176153          8/1987
JP          09-130226          5/1997

(Continued)

OTHER PUBLICATIONS

M.M. Mechaik, "An Evaluation of Single-Ended and Differential Impedance in PCBs", 2001 International Symposium on Quality Electronic Design, Mar. 2001 pp. 301-306.

*Primary Examiner*—Tuan A Pham
(74) *Attorney, Agent, or Firm*—F. Chau & Associates, LLC

(57) ABSTRACT

A low voltage differential signaling transceiver includes a transmitter and a receiver, the transmitter having a first terminal in signal communication with a transmission line, a source resistance in signal communication with the first terminal, a switch in signal communication with the source resistance and in switchable signal communication from ground or an input voltage, a voltage regulator in switchable signal communication with the switch for providing the input voltage to the switch, and a voltage controller in signal communication between the first terminal and the voltage regulator for controlling the input voltage to provide a controlled voltage to a receiver; and the receiver having an amplifier having a first input, a first pad in signal communication with the first input, a load resistance, and a second pad in signal communication with the load resistance, where the first and second pads are both in signal communication with one end of a first transmission line.

13 Claims, 13 Drawing Sheets

FOREIGN PATENT DOCUMENTS

| | | |
|---|---|---|
| JP | 2000-013190 | 1/2000 |
| KR | 1995-016005 | 6/1995 |
| KR | 10-0297904 | 2/1999 |
| KR | 1020010007001 | 1/2001 |
| WO | WO 95/15616 | 6/1995 |
| WO | WO 99/35780 | 7/1999 |

* cited by examiner ions due to the packaging process of the receiver, as well as from design complexity and poor operational frequency of the transceiver.

LOW VOLTAGE DIFFERENTIAL SIGNALING TRANSCEIVER

BACKGROUND OF THE INVENTION

The present disclosure relates to transceivers, and more particularly relates to signaling transceivers. A low voltage differential signaling transceiver is provided.

Where high-speed data transmission is desired, a number of problems exist. For example, a mismatch of the characteristic impedance of the transmission line may lead to signal reflection in the terminal, and/or crosstalk may occur between adjacent signal lines. To address the problem of undesirable signal reflection, two types of impedance matching have been used, which are known as serial termination and parallel termination, respectively.

For serial termination, a serial resistor is added in the signal line; while for parallel termination, a resistor is added between the signal line and ground potential in the receiver. Conventional signaling transceivers suffer from resistance variations due to the packaging process of the receiver, as well as from design complexity and poor operational frequency of the transceiver.

SUMMARY OF THE INVENTION

A low voltage differential signaling transceiver has a transmitter and a receiver. An exemplary transmitter includes a first terminal in signal communication with a transmission line, a source resistance in signal communication with the first terminal, a switch in signal communication with the source resistance and in switchable signal communication from ground or an input voltage, a voltage regulator in switchable signal communication with the switch for providing the input voltage to the switch, and a voltage controller in signal communication between the first terminal and the voltage regulator for controlling the input voltage to provide a controlled voltage to a receiver.

An exemplary receiver includes an amplifier having a first input, a first pad in signal communication with the first input, a load resistance, and a second pad in signal communication with the load resistance, where the first and second pads are both in signal communication with one end of a first transmission line. The scope of the present disclosure will become apparent from the following description of exemplary embodiments, which is to be read in connection with the accompanying drawings.

BRIEF DESCRIPTION OF THE DRAWINGS

The present disclosure presents low voltage differential signaling transceivers in accordance with the following exemplary figures, wherein like elements may be indicated by like reference characters, in which.

DETAILED DESCRIPTION OF PREFERRED EMBODIMENTS

The present disclosure provides for robust low voltage differential signaling transceivers. Embodiments of the present disclosure overcome resistance variations due to the packaging process of the receiver, reduce design complexity of the transceiver, and improve the operational frequency of the transceiver. Transceiver embodiments are robust against varying packaging resistances by adjusting the magnitude of the termination resistor RL to obtain impedance matching, by adding an additional path such that there is substantially no voltage drop of the input signal to the receiver, and by controlling the signal VIN of the transmitter by using a voltage detector.

Figure 1:
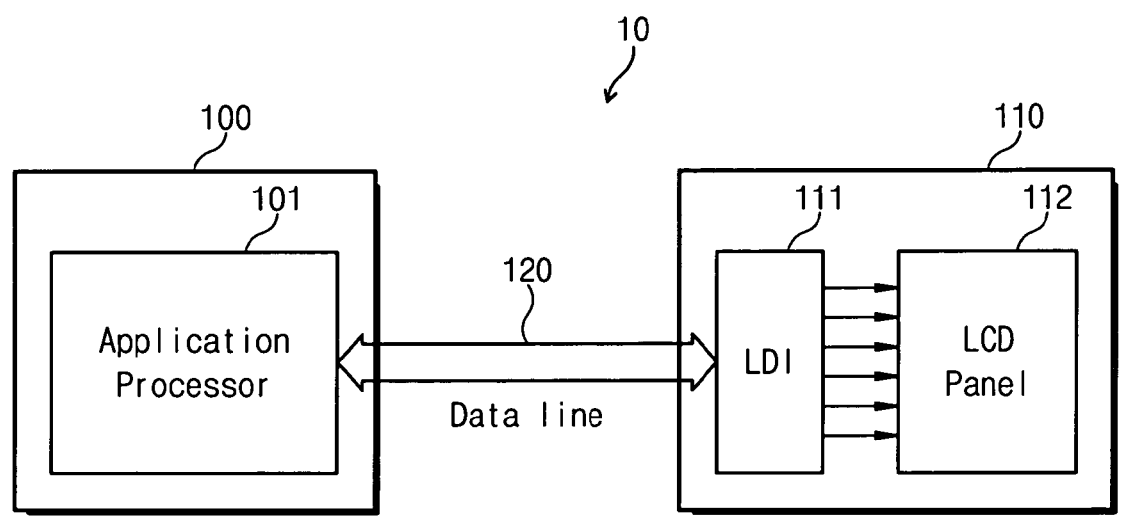
FIG. 1 shows a schematic block diagram for a generic mobile transceiver.

As shown in FIG. 1, a generic mobile system is indicated generally by the reference numeral 10. The mobile system 10 includes a base-band processor 100 in signal communication with a display device 110. The base-band processor 100 includes an application processor 101, which generates display data. The display device 110 includes an LCD Driver IC (LDI) 111 in signal communication with an LCD panel 112. A data or transmission line 120 is in signal communication between the application processor 101 and the LDI 111. Thus, data communication is supported between the application processor 101 and the display device 110 in the mobile system 10.

Various digital interface technologies may be applied to cope with the timing margin and electromagnetic compatibility (EMC) in the data line 120. Such technologies may include low voltage differential signaling (LVDS), reduced swing differential signaling (RSDS), and scalable low voltage signaling (SLVS), for example.

Figure 2:
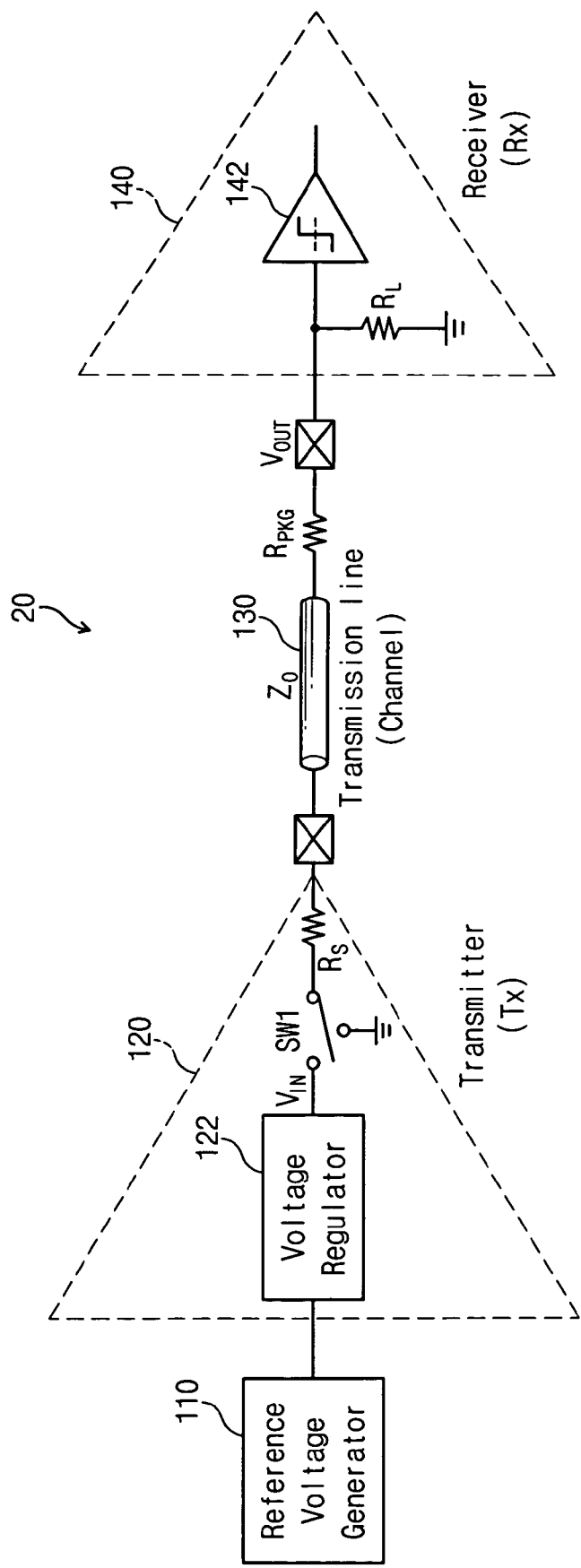
FIG. 2 shows a schematic circuit diagram for a conventional single-ended scalable low voltage signaling transceiver.

Turning to FIG. 2, a conventional single ended SLVS transceiver is indicated generally by the reference numeral 20. The single-ended transceiver 20 includes a reference voltage generator 110, a transmitter (TX) 120 in signal communication with the reference voltage generator 110, a channel 130 in signal communication with the transmitter 120 where the channel 130 can be modeled as transmission line, a package resistance Rpkg in signal communication with the transmission line 130, and a receiver (RX) 140 in signal communication with the package resistance Rpkg for receiving a voltage Vout from the transmission line 130.

The transmitter 120 includes a voltage regulator 122 in signal communication with the reference voltage generator 110, a switch SW1 in signal communication with the voltage regulator 122 for switching an input voltage VIN, and a source resistance RS in signal communication between the switch SW1 and the transmission line 130. The receiver 140 includes an operational amplifier or comparator 142 in signal communication with the package resistance Rpkg, and a load resistance RL in signal communication between the input of the operational amplifier 142 and ground potential.

Here, the receiver 140 converts the analog voltage VOUT into digital data. The single-ended structure may also be implemented as a differential structure. When the impedance is matched, the output voltage VOUT is defined as set forth in Equation 1 of Table A. Drawbacks of this approach include impedance mismatching. For example, when the input impedance (Rpkg+RL, from transmission line to receiver) is not equal to that of transmission line (Zo), the impedance mismatch between the transmission line and the load leads to reflection of the input signal VIN and limits transmission speed. In addition, it is difficult to match the impedance because the package resistance Rpkg varies randomly and by packaging process. For example, the package resistance Rpkg may vary by more than 50 Ω in conventional display applications.

An input voltage reduction of the VOUT signal at the receiver occurs from voltage division. The VOUT signal is voltage divided by RL/(Rpkg+RL) before being applied to the operational amplifier 142, which leads to a reduction of input signal magnitude in the receiver.

To address such issues, the input sensitivity of the receiver and/or the output voltage magnitude of the transmitter are increased. Thus, for a fixed Rpkg, Vin may be controlled to cause a constant Vout. However, if the Rpkg variation is in the range of 0~200 Ω such as by a chip-on-glass (COG) process, Vout varies from 200 mV to 66 mV for RL=Rs=50 Ω and Vin=0.4V. Therefore, an increase of design complexity and/or degradation of operational speed and bit error rate (BER) characteristic results.

Figure 3:
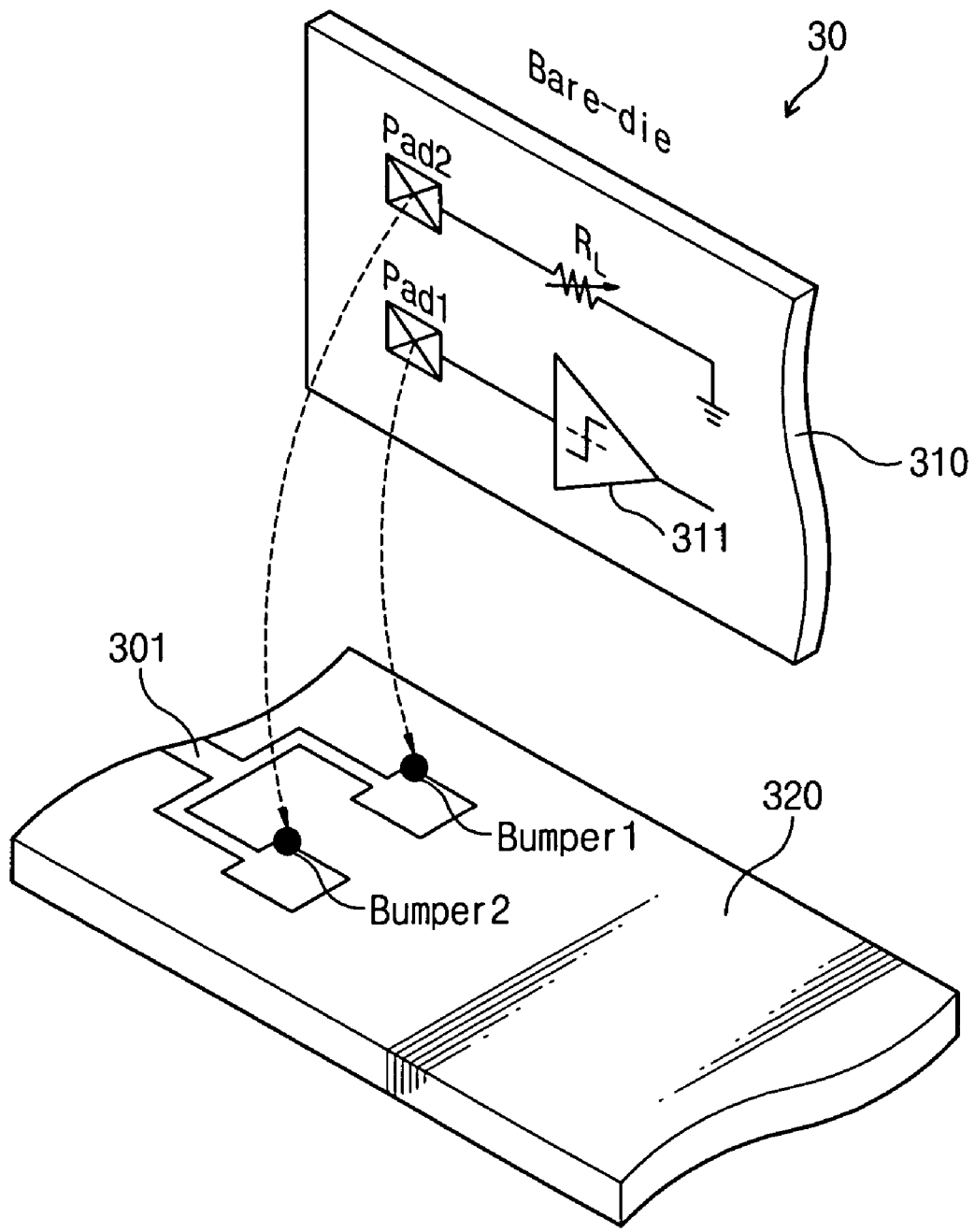
FIG. 3 shows a schematic assembly diagram for a single-ended receiver with relatively low package resistance in accordance with an exemplary embodiment of the present disclosure.

Turning now to FIG. 3, a single-ended receiver embodiment in accordance with principles of the present disclosure is indicated generally by the reference numeral 30. The receiver 30 may be part of a robust transceiver structure that overcomes resistance variations due to the packaging process of the receiver, reduces design complexity of the transceiver, and improves the operational frequency of the transceiver.

The receiver 30 is a single-ended chip-on-glass (COG) type, and includes a receiver chip or bare die 310 and a glass panel 320. The chip 310 includes a conductive pad Pad_1 in signal communication with an operational amplifier (Op-Amp) 311, and further includes a conductive pad Pad_2 in signal communication with a variable load resistance RL that is coupled to ground. The operational amplifier 311 has a high input impedance such that there is substantially no current path to the Op-Amp 311. The glass panel 320 includes a lead-on-glass (LOG) conductor 301, and conductive bumpers Bumper_1 and Bumper_2, where Bumper_1 is disposed in contact alignment with Pad_1 and Bumper_2 is disposed in contact alignment with Pad_2.

Figure 4:
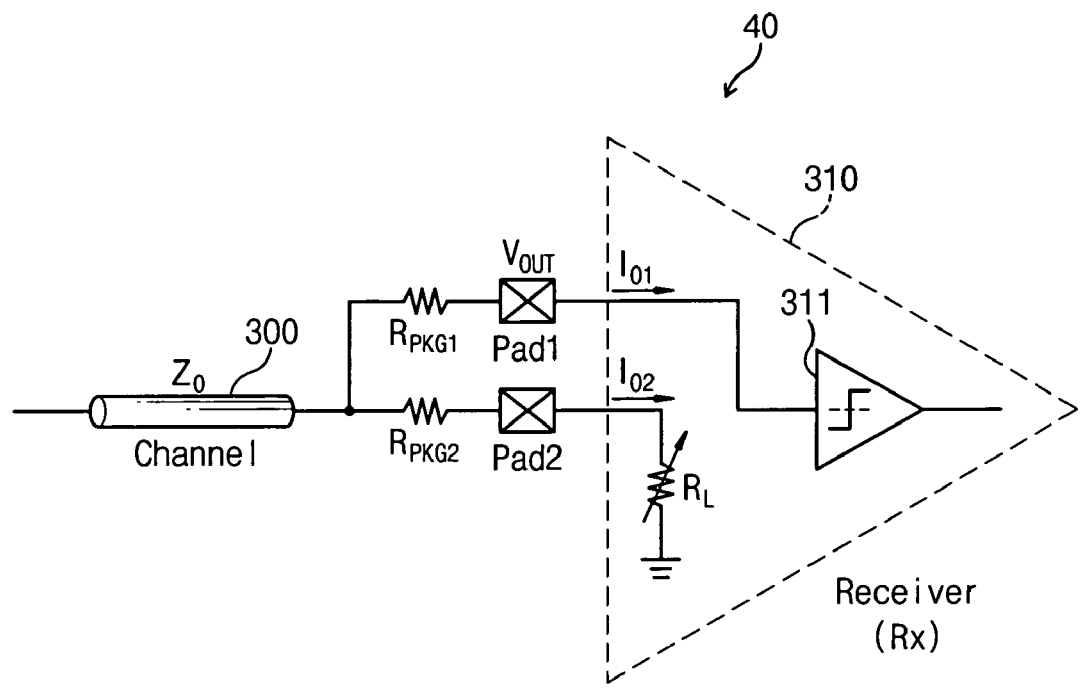
FIG. 4 shows a schematic circuit diagram for the assembly of FIG. 3.

As shown in FIG. 4, the receiver circuit resulting from the receiver structure 30 of FIG. 3 is indicated generally by the reference numeral 40. The circuit 40 includes a channel 300 having a transmission line impedance Zo, first and second packaging resistances Rpkg1 and Rpkg2 in parallel signal communication with the channel 300, a first pad Pad_1 coupled to the packaging resistance Rpkg1, a second pad Pad_2 coupled to the packaging resistance Rpkg2, an operational amplifier 311 in signal communication with the packaging resistance Rpkg1 for receiving the signal Vout, and a variable load resistance RL in signal communication between the packaging resistance Rpkg2 and ground potential.

Thus, the input impedance of the receiver circuit 40 from the transmission line 300 is Rpkg2+RL. By adjusting the RL value, the Rpkg2+RL sum can be matched to the Zo value of the transmission line. For example, the RL value determination for impedance matching where Zo=50 Ω and Rpkg2 is less than Zo value (50 Ω) would set Rpkg2+RL to Zo value (50 Ω), or RL=Zo−Rpkg2=50−Rpkg2. Usually, Rs=Zo. In some cases, Rs may be different from Zo. In such cases, Zo=(Rpkg2+RL) may be used for impedance matching. For the receiver, Zo=Load resistance (Rpkg2+RL) may be used regardless of the Rs value. Rs=Zo=(Rpkg2+RL) is the ideal condition. The RL value can be preset or adjustable by means of an adjusting circuit. This differs from prior art circuits in which the RL value is fixed by specification. In addition, the receiver 30 offers substantially no reduction of input signal magnitude by voltage dividing, since there is no current path through Rpkg1. Thus, Vout of the receiver is as set forth in Equation 2 of Table A.

Therefore, the exemplary receiver 30 is robust against varying packaging resistances by adjusting the magnitude of the termination resistor RL to obtain impedance matching and by adding an additional path such that there is substantially no voltage drop of the input signal to the receiver, and is applicable where the Rpkg2 value is less than the Zo value.

Figure 5:
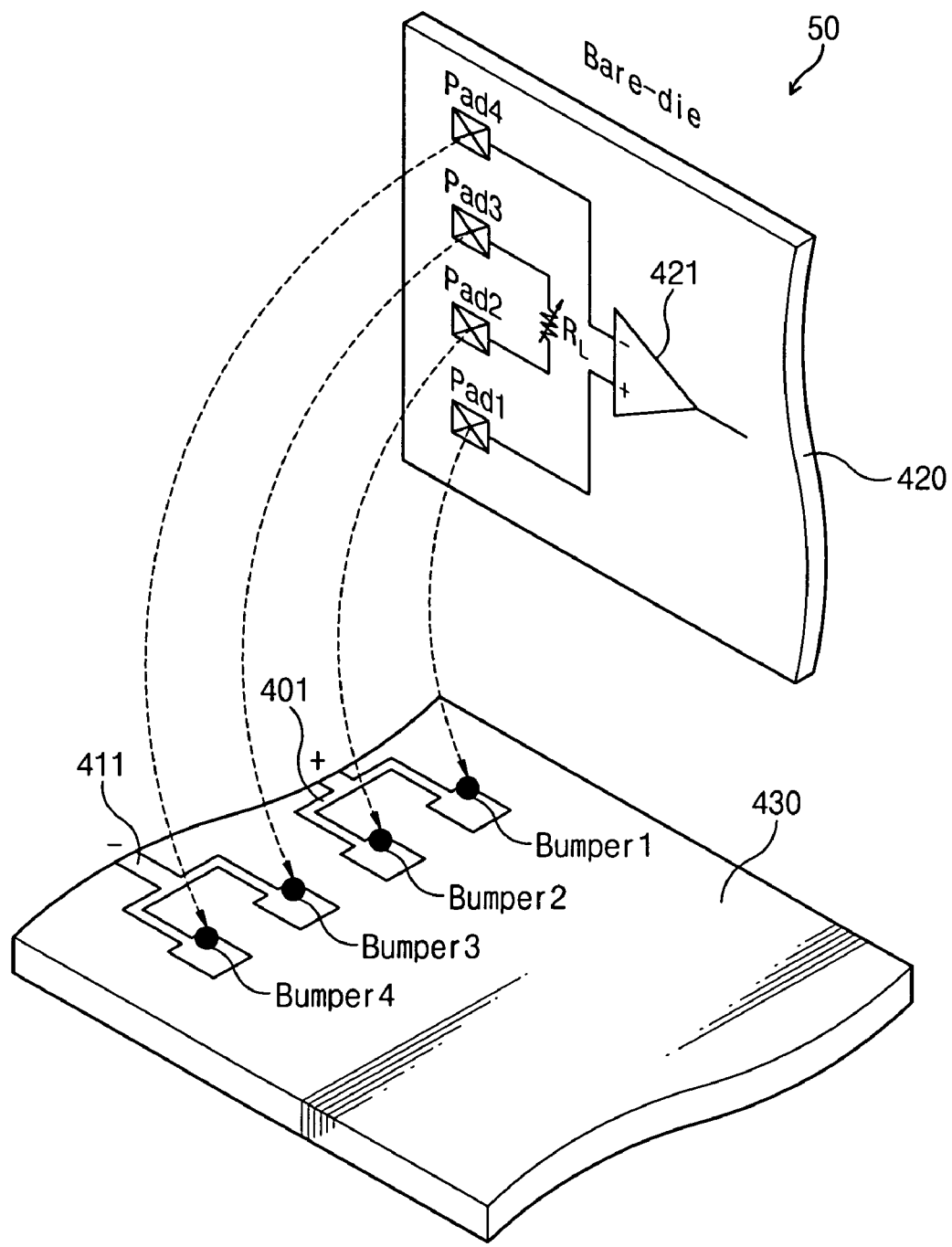
FIG. 5 shows a schematic assembly diagram for a differential receiver with relatively low package resistance in accordance with an exemplary embodiment of the present disclosure.

Turning now to FIG. 5, a differential-type receiver embodiment in accordance with principles of the present disclosure is indicated generally by the reference numeral 50. The receiver 50 may be part of a robust transceiver structure that overcomes resistance variations due to the packaging process of the receiver, reduces design complexity of the transceiver, and improves the operational frequency of the transceiver.

The receiver 50 is a differential-type COG embodiment, and includes a receiver chip or bare die 420 and a glass panel 430. The chip 420 includes a first conductive pad Pad_1 in signal communication with a non-inverting input of an operational amplifier 421, a second conductive pad Pad_2 in signal communication with a first terminal of a variable load resistance RL, a third conductive pad Pad_3 in signal communication with a second terminal of a variable load resistance RL, and a fourth conductive pad Pad_4 in signal communication with an inverting input of the Op-Amp 421. The operational amplifier 421 has high input impedance such that there is substantially no current path to the Op-Amp. The glass panel 430 includes a first LOG conductor 401, a second LOG conductor 411, and conductive bumpers Bumper_1 in signal communication with the first conductor 401, Bumper_2 in signal communication with the first conductor 401, Bumper_3 in signal communication with the second conductor 411 and Bumper_4 in signal communication with the second conductor 411. Bumper_1 is disposed in contact alignment with Pad_1, Bumper_2 is disposed in contact alignment with Pad_2, Bumper_3 is disposed in contact alignment with Pad_3, and Bumper_4 is disposed in contact alignment with Pad_4.

Figure 6:
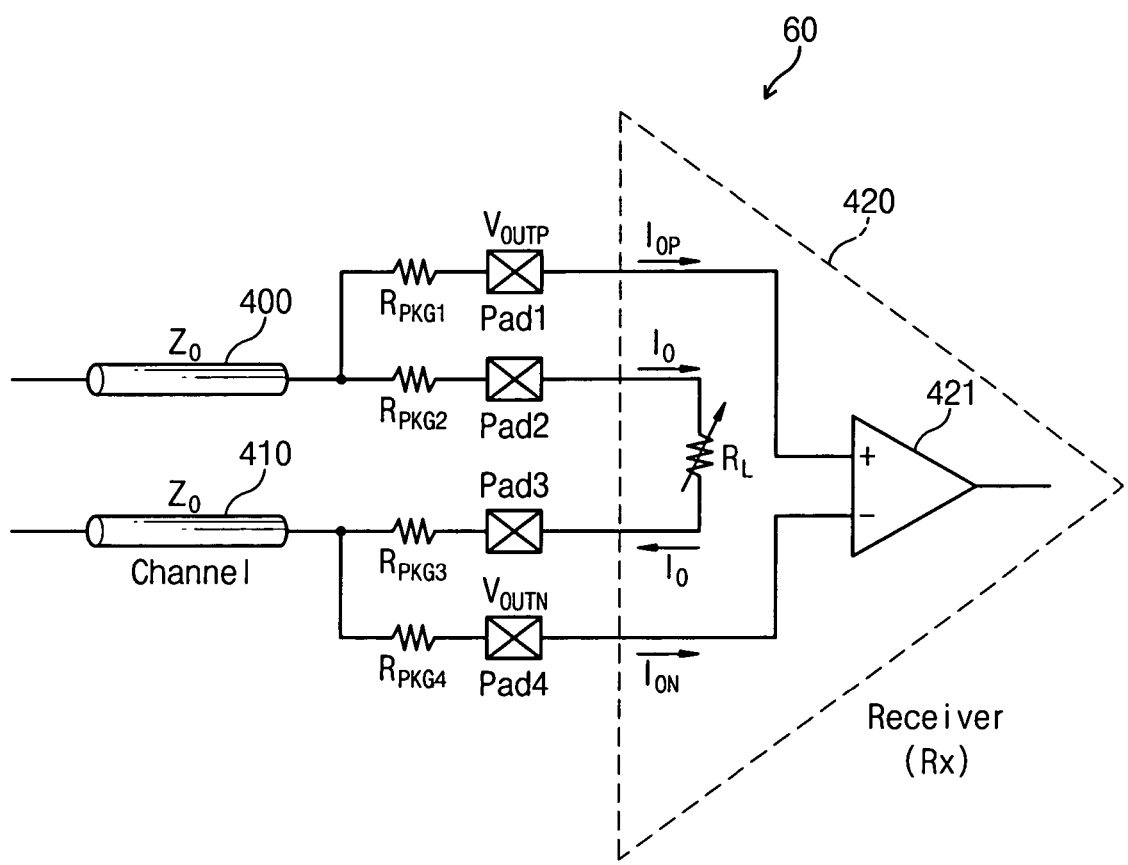
FIG. 6 shows a schematic circuit diagram for the assembly of FIG. 5.

As shown in FIG. 6, the receiver circuit resulting from the receiver structure 50 of FIG. 5 is indicated generally by the reference numeral 60. The circuit 60 includes first and second parallel channels 400 and 410 each having a transmission line impedance Zo. First and second packaging resistances Rpkg1 and Rpkg2 are in parallel signal communication with the first channel 400, where a first pad Pad_1 is coupled to the packaging resistance Rpkg1, and a second pad Pad_2 is coupled to the packaging resistance Rpkg2. Third and fourth packaging resistances Rpkg3 and Rpkg4 are in parallel signal communication with the second channel 410, where a third pad Pad_3 is coupled to the packaging resistance Rpkg3, and a fourth pad Pad_4 is coupled to the packaging resistance Rpkg4.

The receiver circuit 60 further includes a receiver 420. The receiver 420 includes an operational amplifier 421 having a non-inverting input terminal and an inverting input terminal, where the non-inverting input terminal is in signal communication with the packaging resistance Rpkg1 for receiving a signal VoutP and the inverting input terminal is in signal communication with the packaging resistance Rpkg4 for receiving a signal VoutN. The receiver 420 further includes a variable load resistance RL in signal communication between the packaging resistance Rpkg2 and the packaging resistance Rpkg3.

Here, the input impedance of the receiver from the transmission line is Rpkg2+Rpkg3+RL. By adjusting the RL value, the Rpkg2+Rpkg3+RL summation can be matched to the 2×Zo value. The RL value may be adjusted by presetting and/or by adding an adjusting circuit. In addition, substantially no reduction of the input signal magnitude is induced by voltage dividing, since there is substantially no current path through Rpkg1 and Rpkg4. For impedance matching, the RL Value determination where 2×Zo=100 Ω and each of Rpkg2 and Rpkg3 is less than Zo value (50 Ω), Rpkg2+Rpkg3+RL should be matched to 2×Zo (100 Ω). In other words, RL=(2× Zo)−Rpkg2−Rpkg3.

Therefore, the exemplary differential receiver 50 is robust against varying packaging resistances by adjusting the magnitude of the termination resistor RL to obtain impedance matching and by adding an additional path such that there is substantially no voltage drop of the input signal to the receiver, and is applicable where the sum of the second and third packaging resistances (e.g., Rpkg2 and Rpkg3) is less than two times the transmission line impedance Zo.

Figure 7:
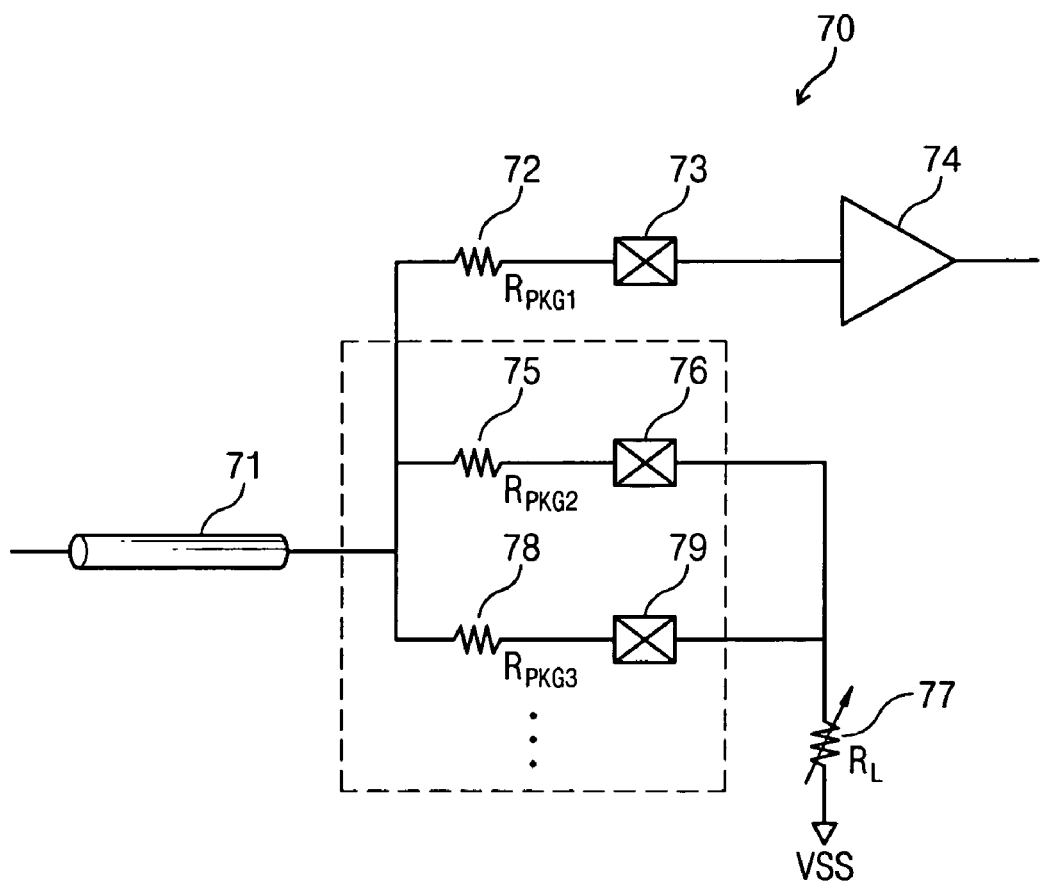
FIG. 7 shows a schematic circuit diagram for a single-ended receiver with relatively high package resistance in accordance with an exemplary embodiment of the present disclosure.

As shown in FIG. 7, another single-ended receiver embodiment is indicated generally by the reference numeral 70. The receiver 70 includes a transmission line 71 in signal communication with a first packaging resistance (Rpkg1) 72, which is coupled with a first pad 73. The first packaging resistance 72 is in signal communication with an operational amplifier 74.

The transmission line 71 is in parallel signal communication with the first packaging resistance 72 as well as with a plurality of other packaging resistances including at least a second packaging resistance 75 and a third packaging resistance 78, where each packaging resistance is associated with a different pad. Here, the packaging resistance 75 is associated with the pad 76 and the packaging resistance 78 is associated with the pad 79. The plurality of packaging resistances including at least the resistances 75 and 78 are in disposed in parallel signal communication between the transmission line 71 and a variable load resistance (RL) 77, which, in turn, is coupled to a grounding potential.

For example, if each Rpkg value is much above 50 Ω while a transmission line impedance value is 50 Ω, the variable load resistance RL may be adjusted to match the transmission line impedance. Therefore, the receiver 70 is similar to the receiver 40 of FIG. 4, but may be used when the packaging resistance values for each pad tend to be higher than transmission line impedance value.

Figure 8:
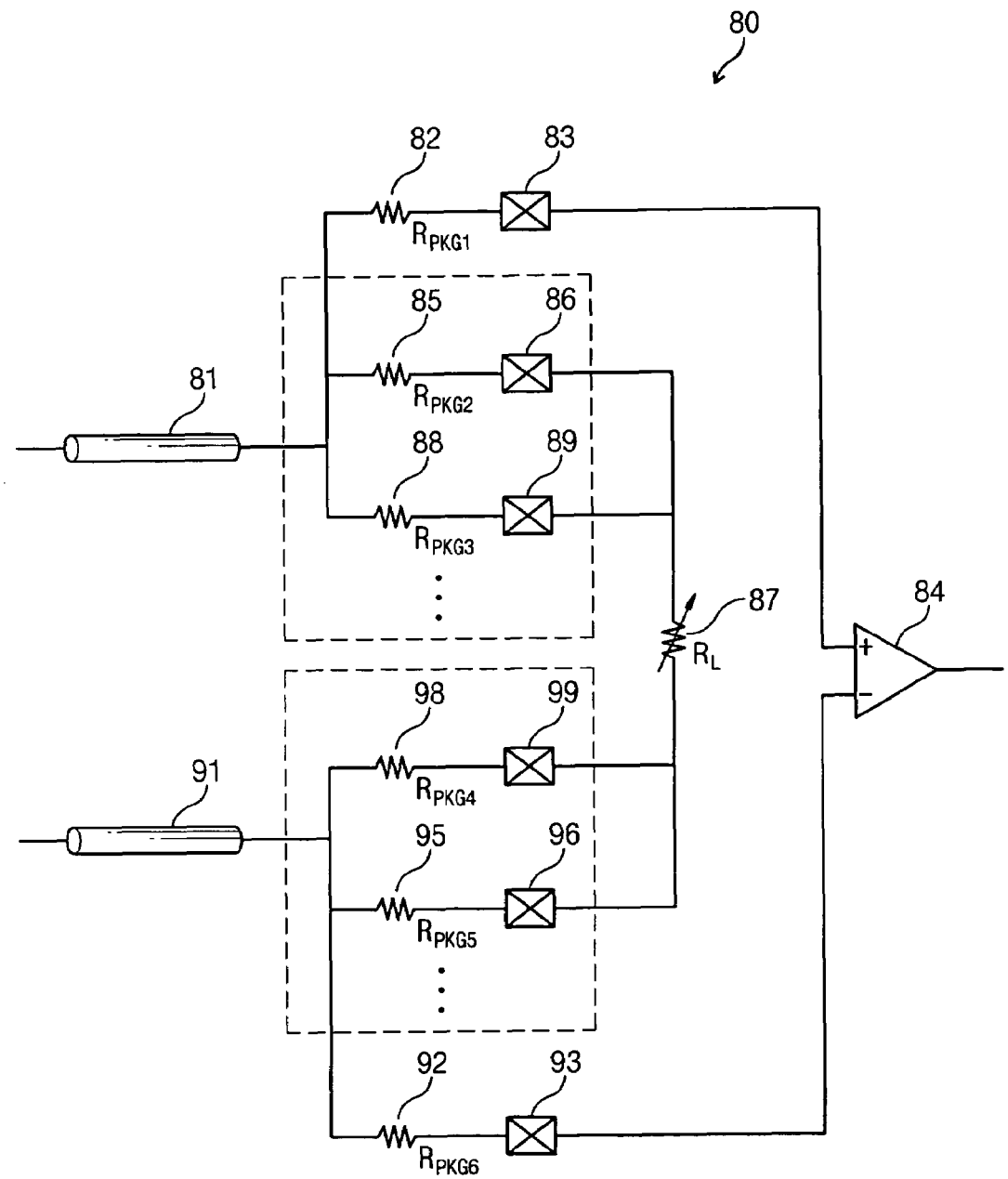
FIG. 8 shows a schematic circuit diagram for a differential receiver with relatively high package resistance in accordance with an exemplary embodiment of the present disclosure.

Turning to FIG. 8, another differential receiver embodiment is indicated generally by the reference numeral 80. The receiver 80 includes a transmission line 81 in signal communication with a first packaging resistance 82, which is coupled with a first pad 83. The first packaging resistance 82 is in signal communication with a non-inverting input of an operational amplifier 84.

The transmission line 81 is in parallel signal communication with the first packaging resistance 82 as well as with a plurality of other packaging resistances including at least a second packaging resistance 85 and a third packaging resistance 88, where each packaging resistance is associated with a different pad. Here, the packaging resistance 85 is associated with the pad 86 and the packaging resistance 88 is associated with the pad 89. The plurality of packaging resistances including at least the resistances 85 and 88 are in disposed in parallel signal communication between the transmission line 81 and first terminal of a variable load resistance 87.

The receiver 80 further includes a second transmission line 91 in signal communication with a sixth packaging resistance 92, which is coupled with a sixth pad 93. The sixth packaging resistance 92 is in signal communication with an inverting input of the operational amplifier 84.

The transmission line 91 is in parallel signal communication with the sixth packaging resistance 92 as well as with a plurality of other packaging resistances including at least a fourth packaging resistance 95 and a fifth packaging resistance 98, where each packaging resistance is associated with a different pad. Here, the packaging resistance 95 is associated with the pad 96 and the packaging resistance 98 is associated with the pad 99. The plurality of other packaging resistances including at least the resistances 95 and 98 are in disposed in parallel signal communication between the transmission line 91 and a second terminal of the variable load resistance 87.

Therefore, the differential receiver 80 is similar to the differential receiver 60 of FIG. 6, but may be used when the sum of a packaging resistance coupled to the first transmission line plus a packaging resistance coupled to the second transmission line tends to be higher than twice the transmission line impedance value Zo.

Figure 9:
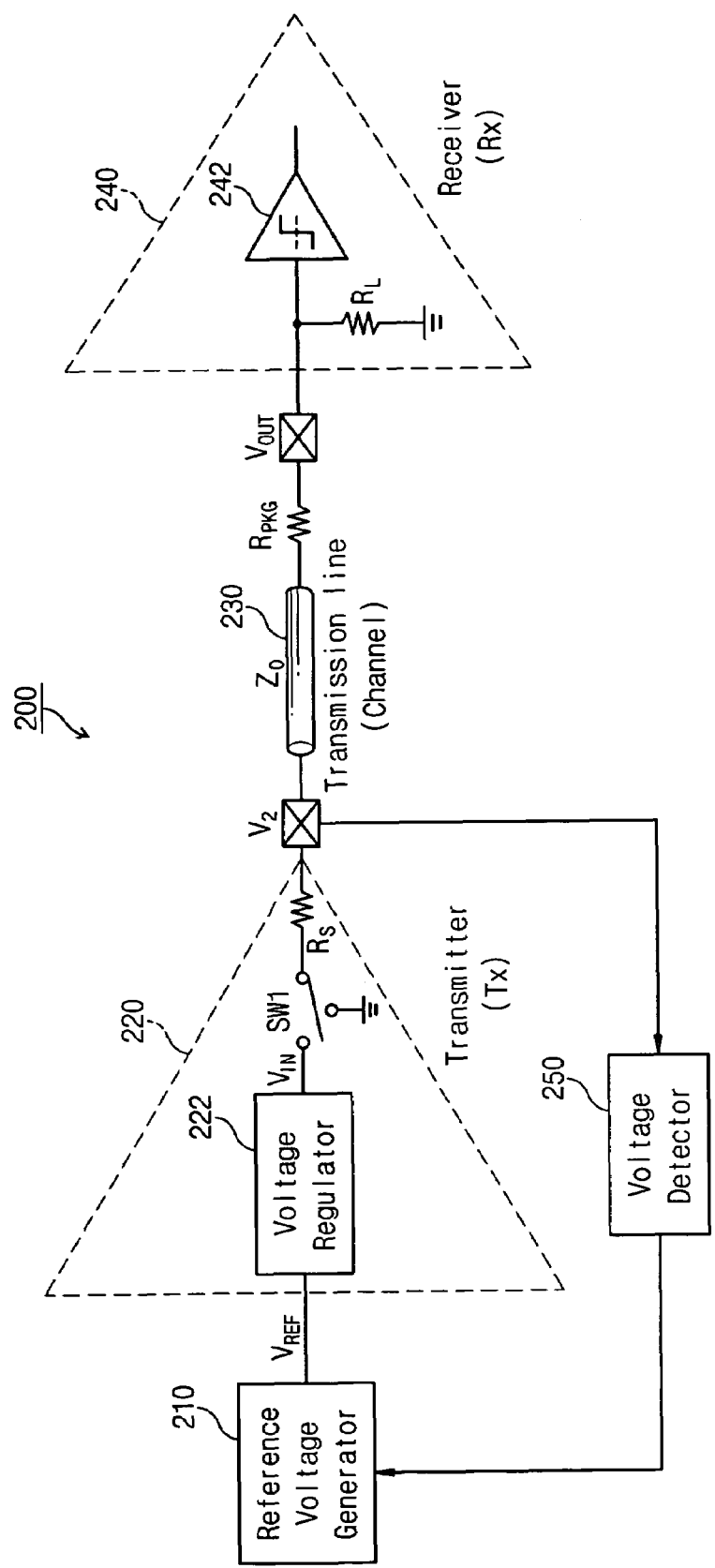
FIG. 9 shows a schematic circuit diagram for a single-ended transceiver with negligible switching resistance in accordance with an exemplary embodiment of the present disclosure.

Turning now to FIG. 9, a single-ended transceiver in accordance with an exemplary embodiment of the present disclosure is indicated generally by the reference numeral 200. The transceiver 200 includes a transmitter 220 in accordance with an exemplary embodiment of the present disclosure and a receiver 240. The receiver 240 is comparable to the receiver 140 of FIG. 2, so duplicate description is avoided.

The transceiver 200 includes the transmitter 220 in signal communication with a terminal V2, which is coupled to a transmission line 230 through a packing resistance Rpkg to the receiver 240. The terminal V2 is in signal communication with a voltage controller, which includes a voltage detector 250 and a reference voltage generator 210. The terminal V2 is connected in signal communication with the voltage detector 250 for providing a V2 voltage to the detector. The voltage detector 250, in turn, is in signal communication with the reference voltage generator 210. The reference voltage generator 210 is in signal communication with a voltage regulator 222 for providing a reference voltage Vref to the voltage regulator. The voltage regulator 222 is in signal communication with a first switchable terminal of a switch SW1 for providing an input voltage VIN to the switch. A second switchable terminal of the switch SW1 is coupled to ground potential, while a fixed terminal of the switch SW1 is in signal communication with a source resistance Rs. The other end of the source resistance Rs is in signal communication with the terminal V2.

In operation of the transceiver 200, the single-ended transmitter 220 has a negligible turn-on resistance for SW1 in this embodiment, which need not be considered as output resistance of the transmitter. The signal VIN of the transmitter 220 is controlled based on the measured Rpkg value. The Rpkg value may be measured during a power-up initialization procedure or during a specific time duration. The voltage detector 250 measures the voltage V2 at a point between the transmitter 220 and the transmission line 230. From the measured voltage, the detector 250 generates a suitable digital value so that reference generator 210 and voltage regulator 222 generate the target Vin voltage.

The measured voltage V2 is as set forth in Equation 3 of Table A, where the impedance Zo is 0 Ω in the DC state, to determine the Rpkg value. From the measured Rpkg value, the transmitter adjusts the Vin value to generate the target Vout as set forth in Equation 4 of Table A. Thus, the reference voltage generator 210 generates the reference voltage Vref in response to the digital value from the detector 250 so that the voltage regulator 222 generates a suitable Vin voltage.

Figure 10:
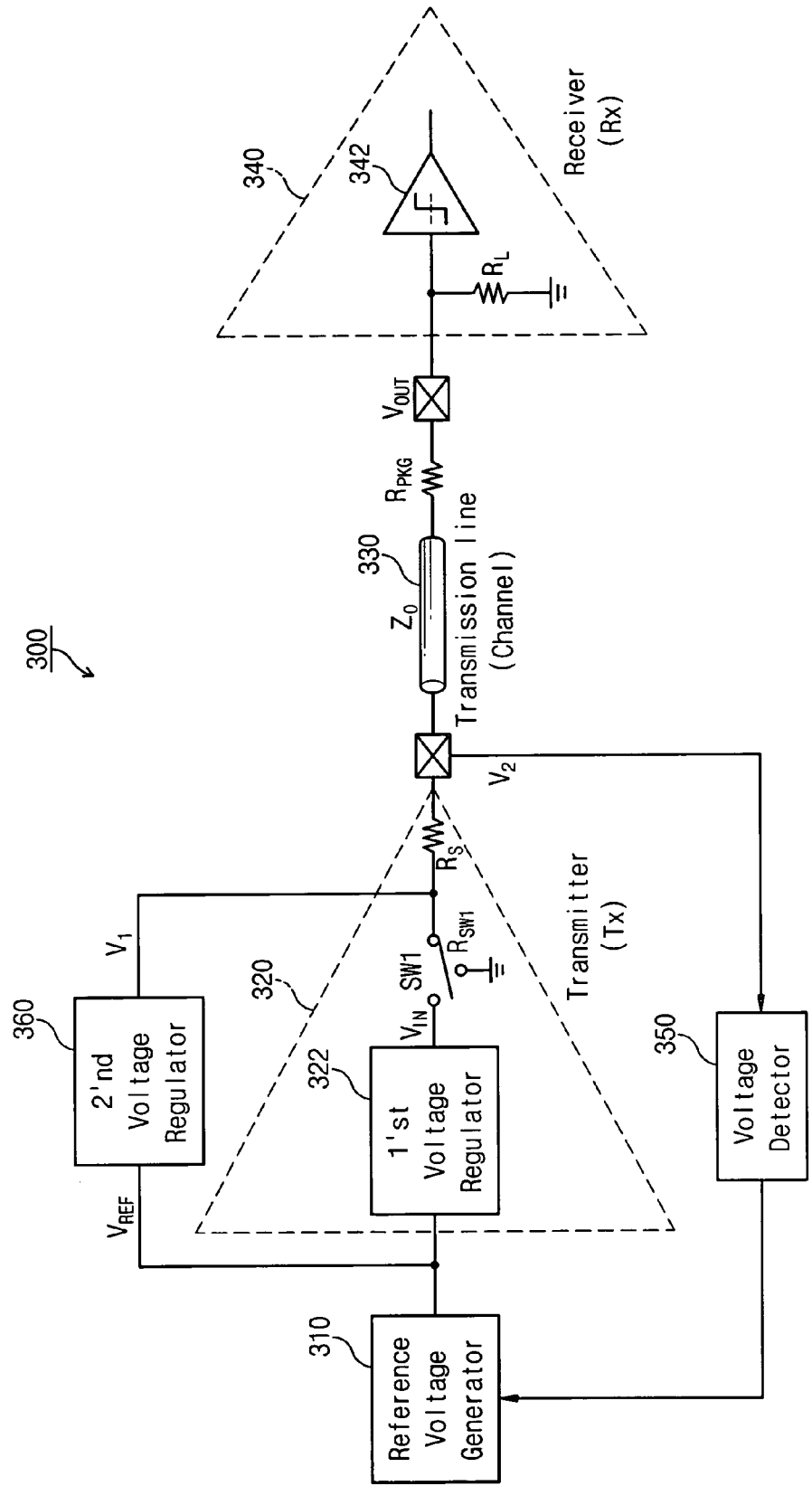
FIG. 10 shows a schematic circuit diagram for a single-ended transceiver with non-negligible switching resistance in accordance with an exemplary embodiment of the present disclosure.

As shown in FIG. 10, a single-ended transceiver in accordance with another exemplary embodiment of the present disclosure is indicated generally by the reference numeral 300. The transceiver 300 is comparable to the transceiver 200 of FIG. 9, so duplicate description is avoided. The transceiver 300 is applicable where the turn-on resistance Rsw1 for the switch SW1 is not negligible, so that it is to be included in the total source resistance of the transmitter. The transceiver 300 includes a second voltage regulator 360 in signal communication between the reference voltage generator 310 and the source resistance Rs.

In operation, the transceiver 300 measures both the turn-on resistance Rsw1 of the switch SW1, as well as the packaging resistance Rpkg. To measure the Rpkg value, the second voltage regulator 360 receives the reference voltage Vref from the reference voltage generator 310 and provides a voltage V1 to the source resistance Rs. The voltage V2 at the terminal V2 is a function of the voltage V1 as set forth in Equation 5 of Table A, where the switch is floating and the voltage detector 350 provides a suitable first digital value to the reference voltage generator 310.

To measure the Rsw1 value, the first voltage regulator 322 provides the voltage Vin in response to the first digital value, and the voltage V2 is determined as a function of VIN as set forth in Equation 6 of Table A. From the measured Rpkg and Rsw1 values, the Vin value is adjusted to generate the target Vout by providing a second digital value from the voltage detector 350 to the reference voltage generator 310, where Vout is a function of Vin as set forth in Equation 7 of Table A. Thus, the voltage detector 350 provides suitable digital values based on the measured Rpkg and Rsw1 values, while the reference voltage generator 310 generates the reference voltage Vref in response to the digital values so that the first voltage regulator 322 generates the suitable Vin voltage.

Figure 11:
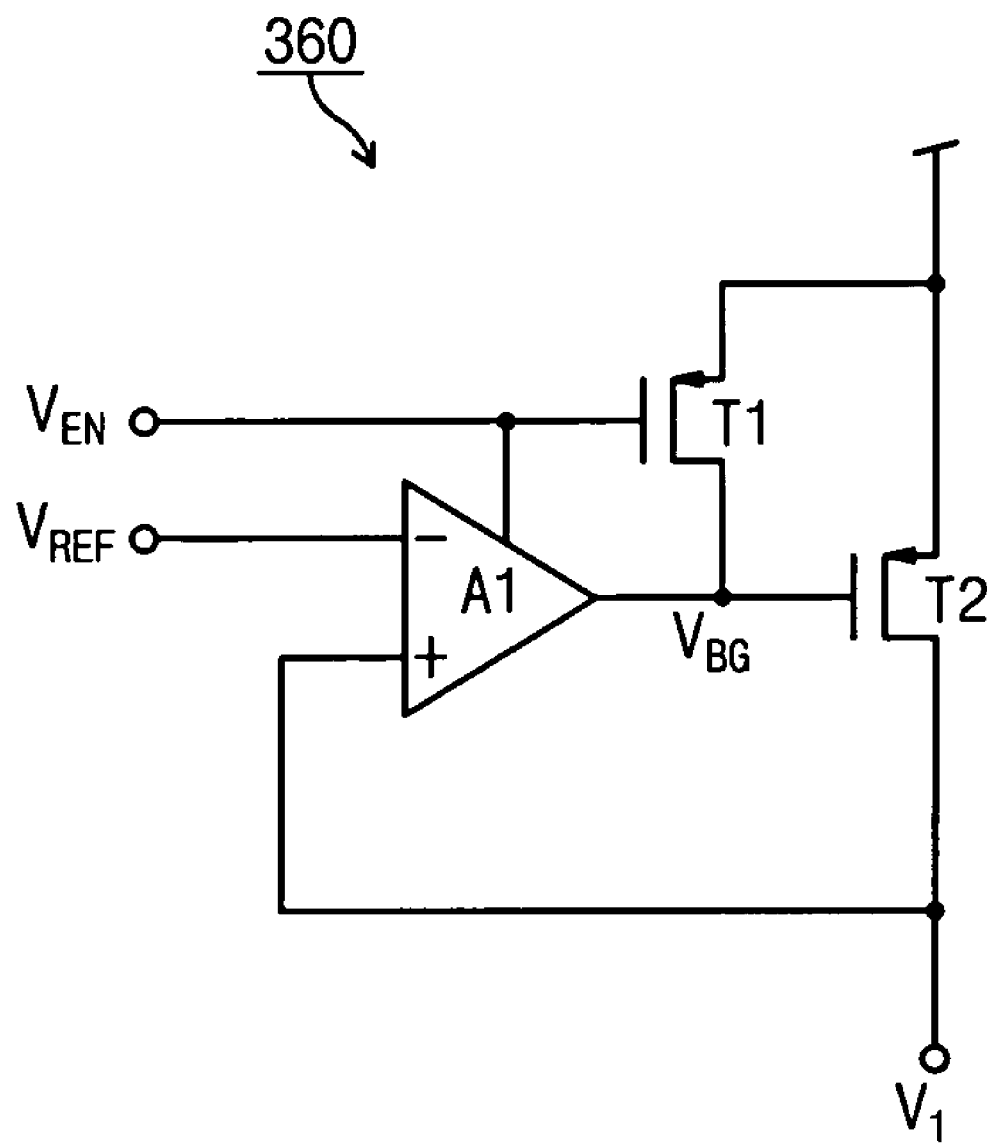
FIG. 11 shows a schematic circuit diagram for the second voltage regulator of FIG. 10.

Turning to FIG. 11, the second voltage regulator 360 of FIG. 10 is shown in greater detail. The second voltage regulator 360 includes an operational amplifier A1, and first and second PMOS transistors T1 and T2. A first terminal for receiving an enable voltage Ven is in signal communication with an enabling input of the op-amp A1 as well as in signal communication with the gate terminal of the transistor T1. The source terminal of the transistor T1 is coupled to a supply voltage, while its drain terminal is in signal communication with the output terminal of the op-amp A1 for an output voltage Vbg. A second terminal is provided for receiving a reference voltage Vref, which is in signal communication with the inverting input of the op-amp A1. The output of the op-amp A1 is also in signal communication with the gate of the second transistor T2. The source terminal of the transistor T2 is coupled to the supply voltage, while its drain terminal is in signal communication with the non-inverting input of the op-amp A1 as well as an output terminal for supplying the voltage V1.

In operation, the second voltage regulator 360 measures Rpkg during power-up. If the control signal Ven is at a high level, a voltage V1 equal to the reference voltage Vref is supplied. After Rpkg is determined, when the control signal Ven is at a low level for disabling the amplifier A1, the voltage Vbg at a high level is supplied; and when the voltage Vbg is at a high level, the voltage V1 is floating.

Figure 12:
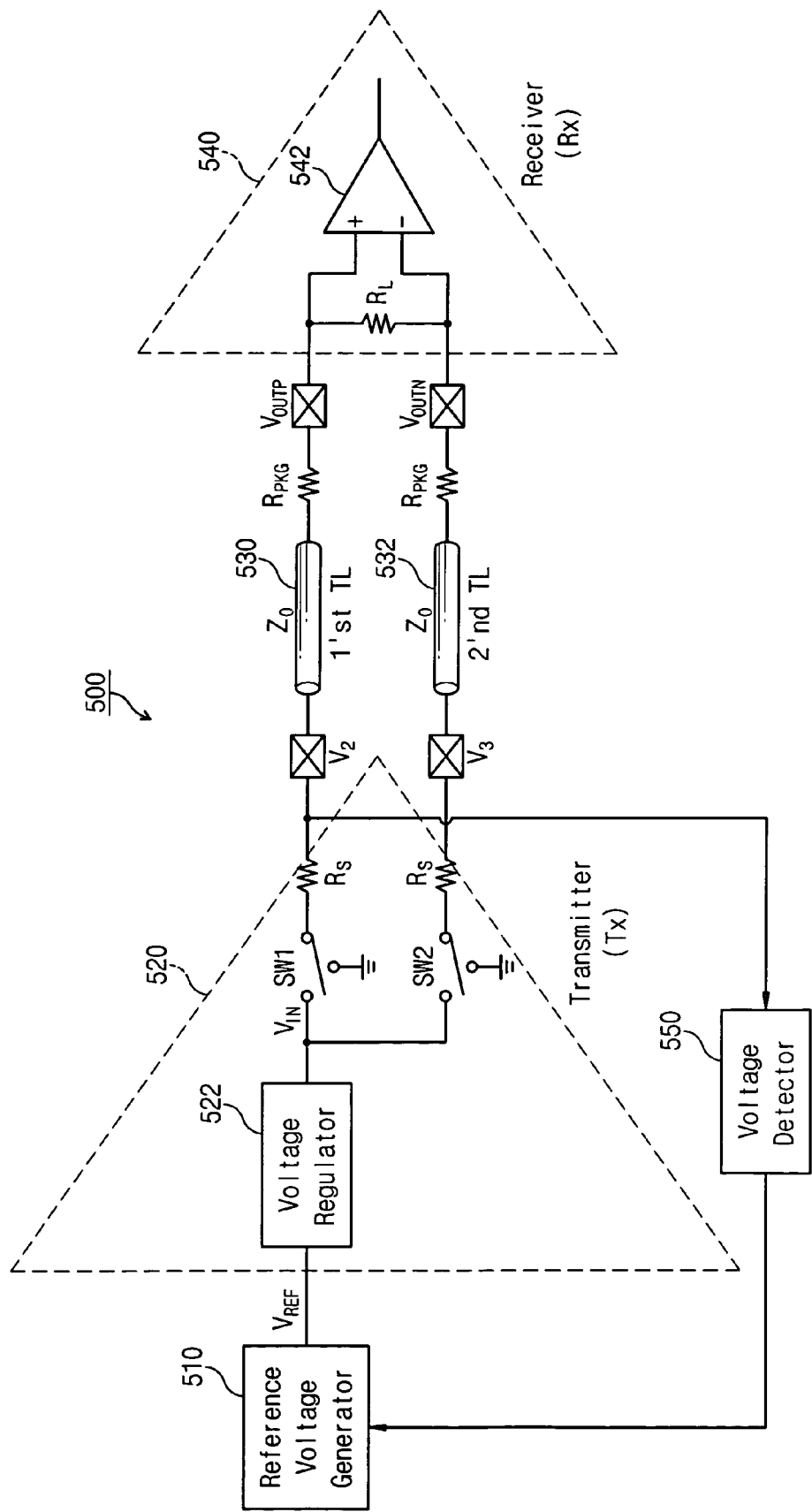
FIG. 12 shows a schematic circuit diagram for a differential transceiver with negligible switching resistance in accordance with an exemplary embodiment of the present disclosure.

Turning now to FIG. 12, a differential type of transceiver in accordance with an exemplary embodiment of the present disclosure is indicated generally by the reference numeral 500. The transceiver 500 includes a differential transmitter 520, a voltage controller having a voltage detector 550 and a reference voltage generator 510, first and second transmission lines 530 and 532, respectively, and a differential receiver 540.

The transceiver 500 includes the differential transmitter 520 in signal communication with terminals V2 and V3. The terminal V2 is coupled to the transmission line 530, through a packing resistance Rpkg to a positive input of the differential receiver 540. The terminal V3 is coupled to the transmission line 532, through another packing resistance Rpkg to a negative input of the differential receiver 540. The terminal V2 is further connected in signal communication with the voltage detector 550 for providing a V2 voltage to the detector. The voltage detector 550, in turn, is in signal communication with the reference voltage generator 510. The reference voltage generator 510 is in signal communication with a voltage regulator 522 for providing a reference voltage Vref to the voltage regulator. The voltage regulator 522 is in signal communication with a first switchable terminal of a first switch SW1 for providing an input voltage VIN to the switch. A second switchable terminal of the first switch SW1 is coupled to ground potential, while a fixed terminal of the first switch SW1 is in signal communication with a source resistance Rs. The other end of the source resistance Rs is in signal communication with the terminal V2. The voltage regulator 522 is in further signal communication with a first switchable terminal of a second switch SW2 for providing the input voltage VIN to the switch. A second switchable terminal of the second switch SW2 is coupled to ground potential, while a fixed terminal of the second switch SW2 is in signal communication with another source resistance Rs. The other end of the source resistance Rs is in signal communication with the terminal V3.

In operation of the transceiver 500, the single-ended transmitter 220 has a negligible turn-on resistance for each of SW1 and SW2 in this embodiment. That is, here the turn-on resistances need not be considered as source resistance of the transmitter. The signal VIN of the transmitter 520 is controlled based on the measured Rpkg value. The Rpkg value may be measured during a power-up initialization procedure or during a specific time duration. The voltage detector 550 measures the voltage V2 at a point between the transmitter 520 and the transmission line 530. From the measured voltage or measured Rpkg value, the detector 550 generates a suitable digital value so that reference generator 510 and voltage regulator 522 generate the target Vin voltage.

The measured voltage V2 is as set forth in Equation 8 of Table A, where the impedance Zo is 0 Ω in the DC state, to determine the Rpkg value. Equation 8 is obtained for SW1 connected to Vin, and SW2 connected to Ground, so the current path is Vin->SW1->Rs->TL(530)->Rpkg->RL->Rpkg->TL(532)->Rs->SW2->Ground. From the current path, the voltage of each node can be obtained. From the measured Rpkg value, the transmitter adjusts the Vin value to generate the target Vout as set forth in Equation 9 of Table A. Thus, the reference voltage generator 510 generates the reference voltage Vref in response to the digital value from the detector 550 so that the voltage regulator 522 generates a suitable Vin voltage.

Figure 13:
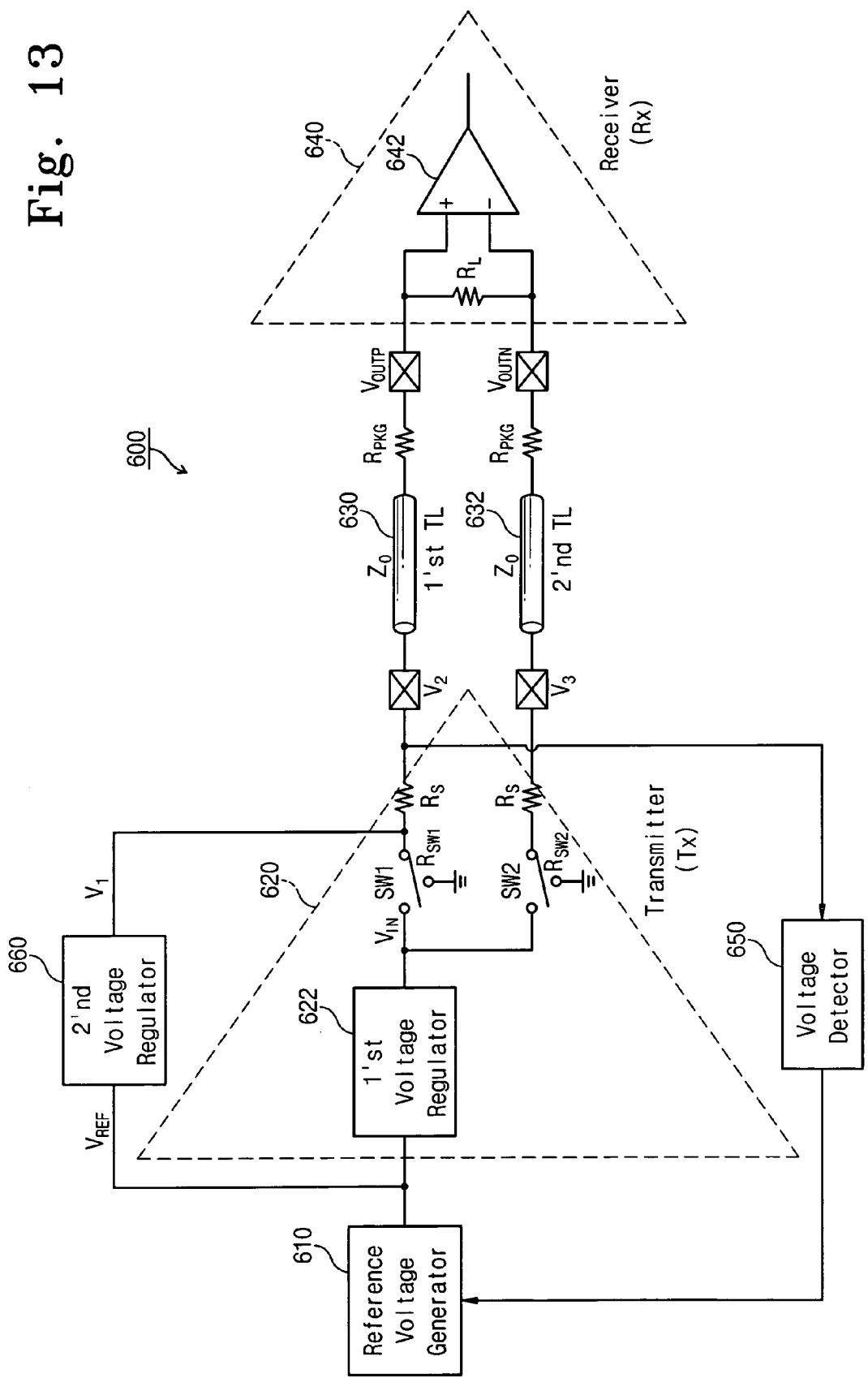
FIG. 13 shows a schematic circuit diagram for a differential transceiver with non-negligible switching resistance in accordance with an exemplary embodiment of the present disclosure.

As shown in FIG. 13, a differential transceiver in accordance with another exemplary embodiment of the present disclosure is indicated generally by the reference numeral 600. The transceiver 600 is comparable to the transceiver 500 of FIG. 12, so duplicate description is avoided. The transceiver 600 is applicable where the turn-on resistances Rsw1 and Rsw2 for the switches SW1 and SW2, respectively, are not negligible, so that these resistances are to be included in the determination of the total source resistance of the transmitter. The transceiver 600 includes a second voltage regulator 660 in signal communication between the reference voltage generator 610 and the first source resistance Rs at the output of the first switch SW1.

In operation, the transceiver 600 measures both the turn-on resistances Rsw1 and Rsw2 of the switches SW1 and SW2, as well as the packaging resistances Rpkg. To measure the Rpkg, Rsw1 and Rsw2 values, first, the second voltage regulator 660 receives the reference voltage Vref from the reference voltage generator 610 and provides a voltage V1 to the first source resistance Rs. The voltage V2 at the terminal V2 is a function of the voltage V1 as set forth in Equation 10 of Table A, where the switch SW1 is floating and the voltage detector 650 provides a suitable first digital value to the reference voltage generator 610. It is assumed that both of Rsw1 and Rsw2 values are equal to Rsw1n Equation 10.

Second, the first voltage regulator 622 provides the voltage Vin in response to the first digital value, and the voltage V2 is determined as a function of VIN as set forth in Equation 11 of Table A. From the measured Rpkg, Rsw1 and Rsw2 values, the Vin value is adjusted to generate the target Vout by providing a second digital value from the voltage detector 650 to the reference voltage generator 610, where Vout is a function of Vin as set forth in Equation 12 of Table A. Thus, the voltage detector 650 provides suitable digital values based on the measured Rpkg, Rsw1 and Rsw2 values, while the reference voltage generator 610 generates the reference voltage Vref in response to the digital values so that the first voltage regulator 622 generates the correct Vin voltage.

These and other features and advantages of the present disclosure may be readily ascertained by one of ordinary skill in the pertinent art based on the teachings herein. For example, it shall be understood that the teachings of the present disclosure may be extended to embodiments with diverse packaging resistance values within a single device. Any materials described to facilitate description may be replaced or augmented with like materials or materials providing like functionality.

In addition, it shall be understood that a relatively small impedance mismatch may be acceptable depending on the particular application. For example, a packaging resistance value of 70 Ω might be acceptable for a transmission line impedance value of 50 Ω without dictating the use of the receiver 70 of FIG. 7 over the receiver 40 of FIG. 4, for example. The exemplary embodiments provide solutions for precise impedance matching without forcing judgment as to when or where a relatively small impedance mismatch might be acceptable. Thus, although both transmitter and receiver embodiments of the present disclosure enable precise impedance matching, those of ordinary skill in the pertinent art may elect an impedance mismatch, such as for cost savings, by applying a non-optimal embodiment for a given application even while practicing within the scope of the present disclosure.

Although illustrative embodiments have been described herein with reference to the accompanying drawings, it is to be understood that the present invention is not limited to those precise embodiments, and that various other changes and modifications may be effected therein by one of ordinary skill in the pertinent art without departing from the scope or spirit of the present invention. All such changes and modifications are intended to be included within the scope of the present invention as set forth in the appended claims.

TABLE A $$V_{OUT} = \frac{R_L}{R_S + R_{PKG} + R_L} \times V_{IN} \quad (\text{Eqn. 1})$$

$$V_{OUT} = \frac{R_L + R_{PKG2}}{R_S + R_{PKG2} + R_L} \times V_{IN} \quad (\text{Eqn. 2})$$

$$V_2 = \frac{R_{PKG} + R_L}{R_S + R_{PKG} + R_L} \times V_{IN} \quad (\text{Eqn. 3})$$

$$V_{OUT} = \frac{R_L}{R_S + R_{PKG} + R_L} \times V_{IN} \quad (\text{Eqn. 4})$$

$$V_2 = \frac{R_{PKG} + R_L}{R_S + R_{PKG} + R_L} \times V_1 \quad (\text{Eqn. 5})$$

$$V_2 = \frac{R_{PKG} + R_L}{R_{SW1} + R_S + R_{PKG} + R_L} \times V_{IN} \quad (\text{Eqn. 6})$$

$$V_{OUT} = \frac{R_L}{R_{SW1} + R_S + R_{PKG} + R_L} \times V_{IN} \quad (\text{Eqn. 7})$$

$$V_2 = \frac{2R_{PKG} + R_L + R_S}{2R_S + 2R_{PKG} + R_L} \times V_{IN} \quad (\text{Eqn. 8})$$

$$V_{OUTP} = \frac{R_L + R_{PKG} + R_S}{2R_S + 2R_{PKG} + R_L} \times V_{IN} \quad (\text{Eqn. 9})$$

$$V_{OUTN} = \frac{R_{PKG} + R_S}{2R_S + 2R_{PKG} + R_L} \times V_{IN}$$

$$V_2 = \frac{2R_{PKG} + R_L + R_S + R_{SW}}{2R_S + 2R_{PKG} + R_L + R_{SW}} \times V_1 \quad (\text{Eqn. 10})$$

$$V_2 = \frac{2R_{PKG} + R_L + R_S + R_{SW}}{2R_{SW} + 2R_S + 2R_{PKG} + R_L} \times V_{IN} \quad (\text{Eqn. 11})$$

$$V_{OUTP} = \frac{R_L + R_{PKG} + R_S + R_{SW}}{2R_{SW} + 2R_S + 2R_{PKG} + R_L} \times V_{IN} \quad (\text{Eqn. 12})$$

$$V_{OUTN} = \frac{R_{PKG} + R_S + R_{SW}}{2R_{SW} + 2R_S + 2R_{PKG} + R_L} \times V_{IN}$$

What is claimed is:

1. A transmitter comprising:
a first terminal in signal communication with a transmission line;
a source resistance in signal communication with the first terminal;
a switch in signal communication with the source resistance, and in switchable signal communication from ground or an input voltage;
a voltage regulator in switchable signal communication with the switch for providing the input voltage to the switch; and
a voltage controller in signal communication between the first terminal and the voltage regulator for controlling the input voltage to provide a controlled voltage to a receiver,
wherein the voltage controller detects a voltage level at the first terminal and a resistance at the receiver end of the transmission line.

2. A transmitter as defined in claim 1, the voltage controller comprising:
a voltage detector; and
an adjustable reference voltage generator in signal communication with the voltage detector.

3. A transmitter as defined in claim 2, the voltage detector comprising a digital circuit responsive to a voltage level at the first terminal and a resistance at the receiver end of the transmission line for providing a digital signal to the adjustable reference voltage generator.

4. A transmitter as defined in claim 1 wherein a resistance of the switch is greater than zero, the transmitter further comprising:
a second voltage regulator in signal communication between the voltage controller and the source resistance.

5. A transmitter as defined in claim 1, further comprising first measuring means for measuring a package resistance at the receiver end of the transmission line.

6. A transmitter as defined in claim 1, further comprising second measuring means for measuring a resistance of the switch.

7. A transmitter as defined in claim 5 wherein:
the voltage controller comprises a voltage detector and an adjustable reference voltage generator in signal communication with the voltage detector; and
the adjustable reference voltage generator generates an adjustable reference voltage responsive to the voltage detector to generate an adjusted transmitter voltage.

8. A transmitter as defined in claim 2, the voltage detector comprising a programmable transfer function indicative of a resistance at the receiver end of the transmission line for receiving a voltage level at the first terminal and providing a signal to the adjustable reference voltage generator in correspondence with the programmable transfer function.

9. A transmitter comprising:
a first terminal in signal communication with a transmission line;
a source resistance in signal communication with the first terminal;
a switch in signal communication with the source resistance, and in switchable signal communication from ground or an input voltage;
a voltage regulator in switchable signal communication with the switch for providing the input voltage to the switch; and
a voltage controller in signal communication between the first terminal and the voltage regulator for controlling the input voltage to provide a controlled voltage to a receiver,
the voltage controller comprising a voltage detector and an adjustable reference voltage generator in signal communication with the voltage detector,
the voltage detector comprising a mapping unit responsive to a voltage level at the first terminal and a resistance at the receiver end of the transmission line for providing a signal to the adjustable reference voltage generator.

10. A transmitter comprising:
a first terminal in signal communication with a transmission line;
a source resistance in signal communication with the first terminal;
a switch having a resistance greater than zero in signal communication with the source resistance, and in switchable signal communication from ground or an input voltage;
a voltage regulator in switchable signal communication with the switch for providing the input voltage to the switch;
a voltage controller in signal communication between the first terminal and the voltage regulator for controlling the input voltage to provide a controlled voltage to a receiver; and
a second voltage regulator in signal communication between the voltage controller and the source resistance, the second voltage regulator comprising:
a differential amplifier having its inverting input in signal communication with the voltage controller for receiving an adjustable reference voltage;
a first PMOS transistor having its gate in signal communication with the output of the differential amplifier, its source in signal communication with a supply voltage, and its drain in signal communication with the first terminal of the transmitter; and
a second PMOS transistor having its gate in signal communication with an enabling input to the differential amplifier, its source in signal communication with the supply voltage, and its drain in signal communication with the output of the differential amplifier.

11. A transmitter as defined in claim 10, further comprising first measuring means for measuring a package resistance at the receiver end of the transmission line.

12. A transmitter as defined in claim 10, further comprising second measuring means for measuring a resistance of the switch.

13. A transmitter as defined in claim 11 wherein:
the voltage controller comprises a voltage detector and an adjustable reference voltage generator in signal communication with the voltage detector; and
the adjustable reference voltage generator generates an adjustable reference voltage responsive to the voltage detector to generate an adjusted transmitter voltage.

* * * * *